United States Patent [19]

Sugino et al.

[11] 4,329,661
[45] May 11, 1982

[54] TERRACED SUBSTRATE SEMICONDUCTOR LASER

[75] Inventors: Takashi Sugino, Takatsuki; Kunio Ito, Uji; Masaru Wada, Takatsuki; Hirokazu Shimizu, Toyonaka, all of Japan

[73] Assignee: Matsushita Electric Industrial Co., Ltd., Kadoma, Japan

[21] Appl. No.: 128,313

[22] Filed: Mar. 7, 1980

[30] Foreign Application Priority Data

Mar. 9, 1979 [JP] Japan .................................. 54-28116
Apr. 20, 1979 [JP] Japan .................................. 54-49518

[51] Int. Cl.³ .............................................. H01S 3/19
[52] U.S. Cl. .................................................. 372/46
[58] Field of Search ................ 331/94.5 H; 357/17, 357/18

[56] References Cited

U.S. PATENT DOCUMENTS 4,296,387 10/1981 Sugino et al. ................ 331/94.5 H Primary Examiner—James W. Davie
Attorney, Agent, or Firm—Cushman, Darby & Cushman

[57] ABSTRACT

A semiconductor laser is comprised of a terrace shaped substrate and
    epitaxially grown layers including an active layer on the substrate. The active layer has an oblique active region formed between an upper horizontal part on the thicker part of the substrate and a lower horizontal part on the thinner part of the substrate. The laser is characterized by a current limiting layer of high resistivity or a layer forming a current limiting p-n junction with the substrate between the lower horizontal part of the active layer and the thinner part of the substrate, thereby limiting the path of the current from the active layer to the substrate almost horizontally through the vertical step wall part between the thinner part and the thicker part.

6 Claims, 13 Drawing Figures

TERRACED SUBSTRATE SEMICONDUCTOR LASER

BACKGROUND OF THE INVENTION

1. Field of the Invention

The present invention relates to an improvement in a semiconductor laser and method of making the same. Especially the present invention relates to a semiconductor laser made by an epitaxial growth method.

2. Prior Art

Hitherto, various proposals configurations and methods of making were made concerning semiconductor lasers for stable fundamental transverse mode operation. In general, fundamental transverse mode operation can be obtained by making the width of a stripe shaped active region narrow, thereby confining only a lowest mode light inthe narrow stripe shaped active region.

Two of the inventors of the present invention already proposed a novel improvement in semiconductor lasers in U.S. patent application Ser. No. 40,182 filed on May 18, 1979, now U.S. Pat. No. 4,296,387. The proposed improvement has the construction as shown in FIG. 1, wherein the laser device is made by multi-layer epitaxial growths on a semiconductor substrate 1. The method of making the semiconductor laser of FIG. 1 has the steps of forming a terraced part with a specified step 1' on a principal face of a semiconductor substrate 1, epitaxially growing on the terrace shaped substrate 1 a first layer 2 as a first clad layer, having a thick part at the foot of the step 1', a second layer 3 as an active layer having an oblique part disposed on the part of the foot of said step 1', in a manner to have a pair of parallel bent parts between said oblique part 3' and upper and lower horizontal parts extending from the oblique part 3', a third layer 4 as a second clad layer, a fourth layer 5 as an ohmic contacting layer, forming a current limiting layer 6 of, for example an insulating layer with a stripe shaped opening 6', forming an ohmic electrode 7 on the current limiting layer 6 to contact the fourth layer 5 through the opening 6', and forming another ohmic electrode 8 on the bottom of the substrate 1, The abovementioned first clad layer 2 is formed in a manner to have thick part 21 at the foot of the step 1' and thin parts on both sides of the thick part 21, so that at the thick part 21 the light does not easily leak out into the substrate 1 and at the thin parts the light easily leaks out into the substrate 1. The active layer 3 has a pair of parallel bent parts defining an oblique lasing region 3' inbetween, with the oblique lasing region 3' being thicker an upper horizontal part and a lower horizontal part of the active region 3. Accordingly, the active region has a construction of a rib type light guide, wherein the light is confined within the space defined between two parallel bent parts. By designing the width between the bent parts narrow to be able to confine only the fundamental transverse mode, a simple spot lasing was obtained.

In the abovementioned laser shown in FIG. 1, the current injected from the electrode 7 is liable to wider spreading on the lower part of the active region 3' and on the lower horizontal part of the active layer 3 than on the central or upper part of the active region 3' because of difference of the distance from the electrode 7. This means that the current injection efficiency of the device of FIG. 1 is not sufficient in comparison with an ideal state that the injected current passes only the active region. Therefore, in order to further improve the current efficiency, a measure to concentrate the current only to the oblique active region to prevent passing of current through the lower horizontal part of the active layer 3 would be considered desirable.

SUMMARY OF THE INVENTION

Accordingly, the present invention is made to provide an improved laser device having an oblique active region, wherein the current passing the active layer can be concentrated within the oblique active region, thereby to provide a laser capable of efficient spot lasing.

DESCRIPTION OF PREFERRED EMBODIMENT

A semiconductor laser in accordance with the present invention is comprised of:

a terrace shaped substrate having a step between a thicker part and a thinner part and epitaxially grown layers including a first clad layer and active layer which is disposed on said first clad layer and has a stripe shaped oblique active region formed between an upper horizontal part formed above said thicker part and a lower horizontal part formed above said thinner part. The active region is defined by an upper bending part formed between said active region and said upper horizontal part and a lower bending part formed between said active region and said lower horizontal part.

An electrode is formed on said epitaxially grown layers at least above said oblique active region.

A current limiting layer to prevent a current from flowing therethrough is disposed between said first clad layer and said thinner part of the substrate in a manner to cover said thinner part by extending to the lower end of the step. The thickness of said current limiting layer is smaller than the height of said step thereby allowing the vertical wall of said step part of the substrate to contact the lowest layer of said epitaxially grown layers.

Preferred embodiments of the present invention are elucidated referring to FIG. 2(a)-2(e) and FIG. 4(a)-4(f).

Figure 2:
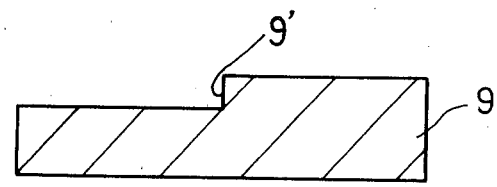
FIGS. 2(a), 2(b), 2(c), 2(d) and 2(e) are sectional side views showing steps of making a semiconductor laser in accordance with the present invention.
Figure 2:
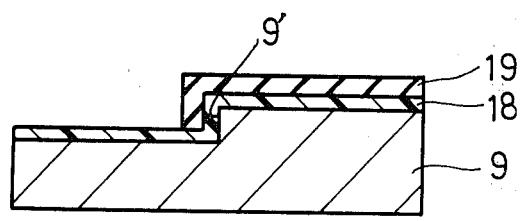
Figure 2:
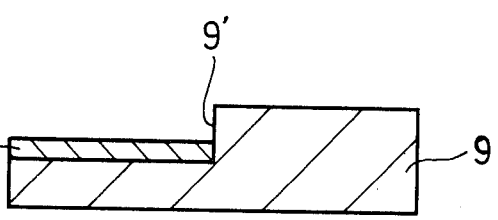
Figure 2:
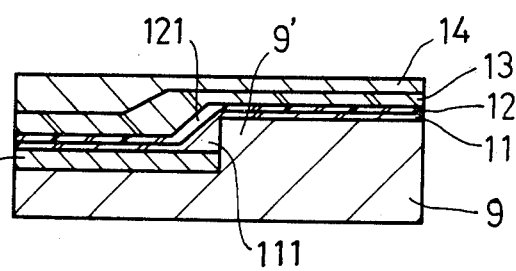
Figure 2:
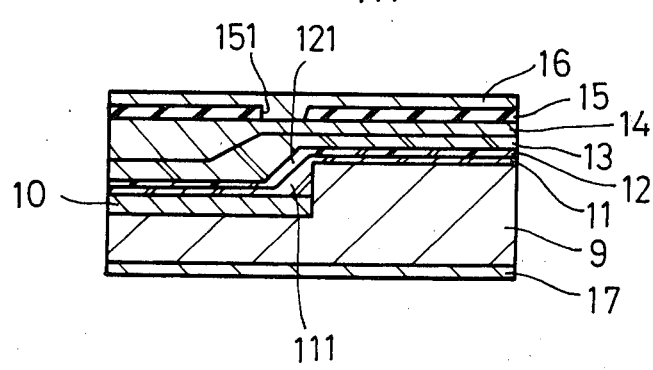

FIGS. 2(a), 2(b), 2(c), 2(d) and 2(e) show steps of making a semiconductor laser embodying the present invention. First, an outline for making the semiconductor layer is elucidated. As shown in FIG. 2(a), a substrate 9 of n-type conductivity is formed into a terrace shape to have a thinner part and a thicker part between which a step 9' is formed. Then, as shown in FIG. 2(b), an oxide film 18 is formed on all the principal face, and further thereon a silicon nitride film 19 as a diffusion prevention film is formed on the thicker part and on the step part. Thereafter, a p-type impurity is diffused into the surface of the thinner part through the silicon oxide film 18, and then the oxide film 18 and the silicon nitride film 19 are removed, thereby obtaining the terrace shaped substrate 9 with the p-type diffused region 10 on the thinner part as shown in FIG. 2(c). Then on this substrate 9, epitaxial growths are made thereby to form a first clad layer 11 of n-type conductivity,
an active layer 12 of n-type conductivity,
a second clad layer 13 of p-type conductivity and
an electrode contacting layer 14 of p-type conductivity, as shown in FIG. 2(d). Therein the first clad layer 11 is formed thick and triangular at the part 111 at the foot of the step 9' and formed thin and horizontal on the surface of the thin part of the substrate and on the surface of the thick part of the substrate 9, so that the light easily leaks into the underlying layers through the thin-formed horizontal parts but hardly leaks into the substrate 9 through the thick and triangular part 111, thereby preventing lasing in the part of the active layer 12 which is on the thin-formed parts and preventing absorption of lasing to the substrate 9 from the part of the active layer 12 which is on the thick and triangular part 111. The active layer 12 is also formed thick at the part 121 on the thick and triangular part 111 of the first clad layer 11 and formed thin at the parts on the thin formed parts of the first clad layer 11. The thick part 121 of the active layer 12 is formed into a stripe shape defined by a pair of bent parts, through which the thick part 121 is connected to the thinner parts of the active layer 12. Thus, the lased light is confined in the active region defined by the two parallel bent parts.

Then an insulating layer 15 is formed on the electrode contacting layer 14 and a stripe shaped opening 151 is formed therein. Zn as a p-type impurity is diffused through the opening 151 on the shallow surface part of the electrode contacting layer 14, and thereafter, a p-side electrode 16 is formed on the insulating film 15 and, through the opening 151, on the electrode contacting layer 14. Finally, an n-side electrode 17 is formed on the bottom of the substrate 9, and the semiconductor laser device is completed as shown by FIG. 2(e).

A more concrete example of making the semiconductor laser of FIG. 2(e) is elucidated in the following concerning the laser utilizing an n-type GaAs substrate and having GaAs, $Ga_{1-x}Al_xAs$, $(0 < X < 1)$ construction.

A substrate 9 of n-type conductivity of the carrier concentration of $n \simeq 1 \times 10^{17} Cm^{-3}$ has a (100) face as the principal face. As shown in FIG. 2(a) the substrate is formed into a terrace shape to have a thinner part and a thicker part between which is a step of about 2 $\mu$m in $<01\bar{1}>$ or $<011>$ direction by a chemical etching employing an etchant containing $H_2SO_4$ and $H_2O_2$ utilizing a photoresist mask. Then, as shown in FIG. 2(b), a 1500Å thick $SiO_2$ film 18 is formed by a chemical vapor deposition (CVD) method on all the principal face including the vertical wall face at the step part 9'. Thereafter, an about 3000Å thick silicon nitride ($Si_3N_4$) film 19 as a diffusion prevention film is formed by sputtering on the thicker part and on the step part 9'. Then, the GaAs substrate is sealed in an evacuated enclosure together with a piece of $ZnAs_2$ as an impurity source of Zn, and the enclosure is raised to 750° C. thereby to diffuse Zn through the silicon oxide film 18 into the surface of the thinner part of the substrate to the depth of about 2 $\mu$m by utilizing the silicon nitride film 19 as a diffusion mask. Thereby, a diffused p-type region 10 of the surface carrier concentration of $1-3 \times 10^{17} Cm^{-3}$ and a p-n junction thereunder are formed in the substrate. The silicon dioxide film 18 and the overriding silicon nitride film 19 are removed, consequently forming the terrace shaped substrate 9 having a current limiting diffused region 10 on the thinner part as shown in FIG. 2(c). Then on the substrate of FIG. 2(c), sequential liquid epitaxial growths are made under the condition of:

growth starting temperature—845° C.
cooling rate—0.5° C./min.

to form the following layers as shown in FIG. 2(d), first clad layer 11 of—n-type $Ga_{0.65}Al_{0.35}As$ (0.2 $\mu$m thick at the horizontal part, Sn doped—$n \simeq 5 \times 10^{17} Cm^{-3}$), active layer 12 of—n-type $Ga_{1-y}Al_yAs$, $(0 \leq y \leq 0.05)$ (0.5 $\mu$m thick at the horizontal part, non-doped—$n = 2-3 \times 10^{16} Cm^{-3}$), second clad layer 13 of—p-type $Ga_{0.65}Al_{0.35}As$ (1 $\mu$m thick at the part above the thicker part of substrate, Ge-doped—$p \simeq 1 \times 10^{17} Cm^{-3}$), and an electrode contacting layer 14 of—p-type GaAs (1 $\mu$m thick at the part above the thicker part of substrate, Ge-doped—$p \simeq 1 \times 10^{18} Cm^{-3}$).

The thickness of the triangular part 111 formed in the first clad layer 11 at the foot of the step 9' is about 1 $\mu$m and the thickness of the oblique active region 121 on the triangular part 111 is about 0.06 $\mu$m. Thereafter, a 3000Å thick silicon nitride film 15 is formed by the sputtering method and a stripe shaped opening 151 of 5 $\mu$m width is formed thereon at the part above the oblique active region 121. Then, a second Zn-diffusion is made by the same way as that of the previous one to form a Zn diffusion layer of 0.5 $\mu$m depth and surface concentration of $1 \times 10^{19} Cm^{-3}$. A p-side electrode 16 of Au-Ge-Ni alloy is formed by vapor deposition followed by an alloying treatment on the surface of the wafer, and thereby the electrode contacts the electrode contacting layer 14 through the opening 151. After etching the bottom face of the substrate 9 to adjust the thickness of the whole wafer within 100 $\mu$m, an n-side electrode 17 of Au-Ge-Ni alloy is formed on the etched bottom face by vapor deposition followed by alloying treatment, and the laser device is completed as shown in FIG. 2(e).

The laser made by the abovementioned steps has the current limiting layer 10 under the lower horizontal part and the oblique active region 121 of the active layer 12, and therefore most of the current injected from the p-side electrode 16 is necessarily converged to pass from the stripe shaped opening 151 through the oblique active region 121 of the active layer 12 and triangular part 111 of the first clad layer 11 and flows almost horizontally through the vertical wall part at the step 9' of the substrate 9. Thus, since the current path is narrowly converged both by the stripe shaped opening 151 and the vertical wall part at the step 9', the current is effectively converged to and injected almost vertically into the oblique active region 11, thereby improving injection efficiency. Besides, because the active region 121 is defined by the bent parts on both sides thereof, confinement of the fundamental transverse mode is easy, thereby a single spot lasing is obtainable.

Figure 1:
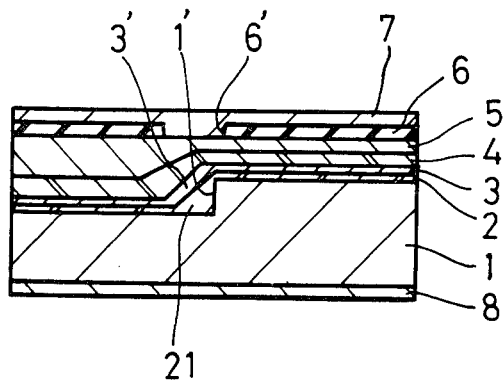
FIG. 1 is the sectional side view of the prior art semiconductor laser whose invention has been applied for a patent in U.S. patent application Ser. No. 40,182.
Figure 3:
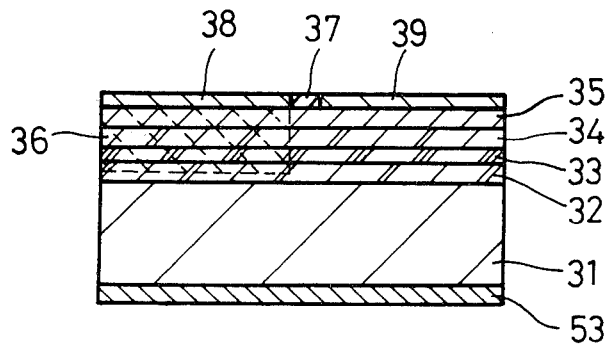
FIG. 3 is a sectional side view of a conventional semiconductor laser of transverse junction structure type.

In order to obtain good heat radiation of the semiconductor laser, it is preferable to mount, at the part near the active layer, the laser on a heat sink. On the other hand, in order to make the semiconductor laser in an integrated circuit, it is preferable to form both the p-side electrode and the n-side electrode of the semiconductor laser on the same top side face of the substrate with a view towards reliability of electric connection and efficiency of the optical connection to an optical fiber. In order to meet the abovementioned requirements, a laser named transverse junction stripe type (TJS laser) as shown in FIG. 3 has been proposed. In an example of the TJS laser of FIG. 3, the following n-type epitaxial growth layers are formed on a substrate 31 of n-type GaAs:

a first clad layer 32 of n-type $Ga_{1-x}Al_xAs$,
an active layer 33 of n-type GaAs,
a second clad layer 34 of n-type $Ga_{1-x}Al_xAs$,
an electrode contacting layer 35 of n-type GaAs.

The dotted-line-hatched part, namely almost all the left half side of the epitaxial growth layers 32 to 35 are converted into p-type by selective diffusion of zinc as an impurity. A p-side electrode 38 and an n-side electrode 39 separated by an $Si_3N_4$ insulation film 37 are formed on the p-type part and on the n-type part of the electrode contacting layer 35, respectively. In such a TJS laser, light lased in the active layer 33 does not have an isotropic divergence angle, and accordingly its far field pattern is not spot shaped.

The example of FIG. 4(a)–4(f) embodying the present invention can lase a light having an isotropic divergence and has a spot shaped far field pattern, though having both p-side and n-side electrodes on its top face of the epitaxial growth layers and a metal film to be connected to the heat sink on the bottom face of the substrate, thus assuring usability and reliability when made in an integrated circuit.

Figure 4:
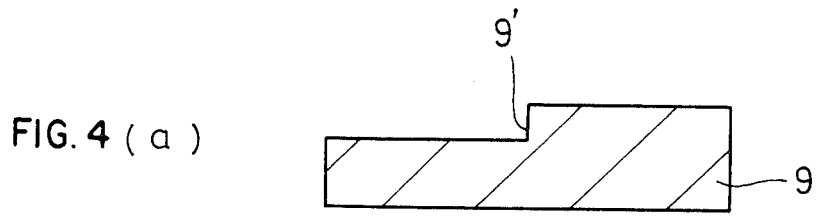
FIGS. 4(a), 4(b), 4(c), 4(d), 4(e) and 4(f) are sectional side views showing steps of making another semiconductor laser in accordance with the present invention.
Figure 4:
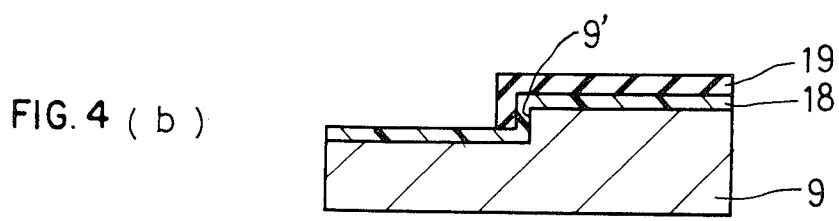
Figure 4:
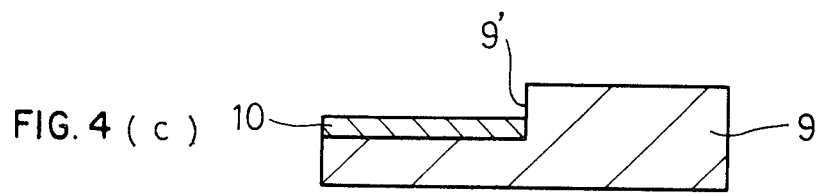
Figure 4:
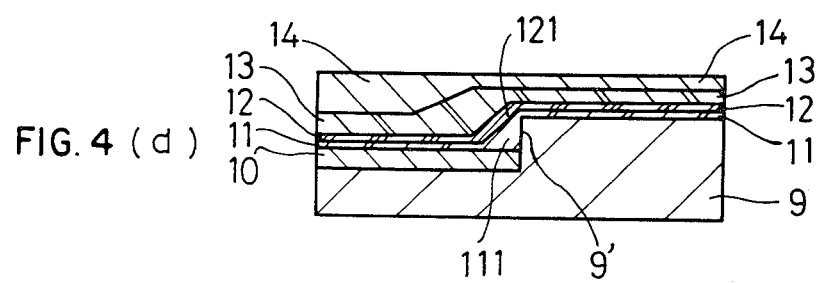
Figure 4:
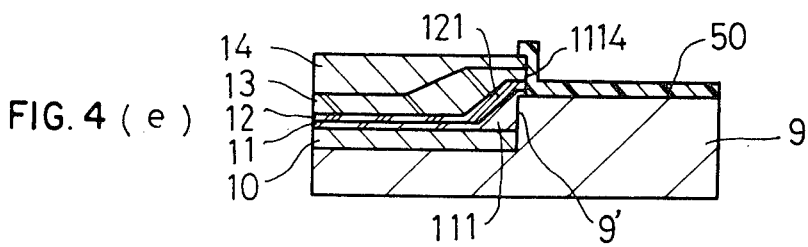
Figure 4:
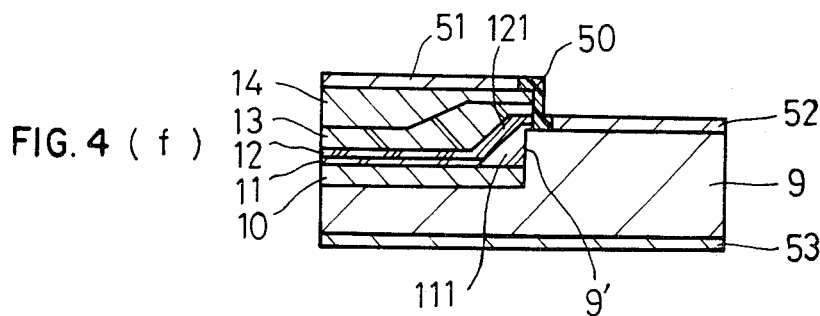

FIGS. 4(a), 4(b), 4(c), 4(d), 4(e) and 4(f) show the steps of making a second semiconductor laser embodying the present invention. First, an outline for making the second example semiconductor layer is elucidated. As shown in FIG. 4(a), a substrate 9 of n-type conductivity is formed into a terrace shape to have a thinner part and a thicker part between which a step 9' is formed. Then, as shown in FIG. 4(b), an oxide film 18 is formed on all the principal face, and further thereon a silicon nitride film 19 as a diffusion prevention film is formed on the thicker part and on the step part. Thereafter, a p-type impurity is diffused into the surface of the thinner part through the silicon oxide film 18. The oxide film 18 and the silicon nitride film 19 are removed, thereby obtaining the terrace shaped substrate 9 with the p-type diffused region 10 on the thinner part as shown in FIG. 4(c). Then on this substrate 9, epitaxial growths are made thereby to form a first clad layer 11 of n-type conductivity,
an active layer 12 of n-type conductivity,
a second clad layer 13 of p-type conductivity and
an electrode contacting layer 14 of p-type conductivity, as shown in FIG. 4(d). The first clad layer 11 is formed thick and triangular at the part 111 at the foot of the step 9' and formed thin and horizontal on the surface of the thin part of the substrate and on the surface of the thick part of the substrate 9, so that the light easily leaks into the underlying layers through the thin-formed horizontal parts but hardly leaks into the substrate 9 through the thick and triangular part 111, thereby preventing lasing in the part of the active layer 12 which is on the thin-formed parts and preventing absorption of lasing to the substrate 9 from the part of the active layer 12 which is on the thick and triangular part 111. The active layer 12 is also formed thick at the part 121 on the thick and triangular part 111 of the first clad layer 11 and formed thin at the parts on the thin formed parts of the first clad layer 11. The thick part 121 of the active layer 12 is formed into a stripe shape defined by a pair of bent parts, through which the thick part 121 is connected to the thinner parts of the active layer 12. Thus, the lased light is confined in the active region defined by the two parallel bent part 4.

Then parts of the epitaxial growth layers 11 to 14 which are on the thicker part of the substrate 9 are removed by chemical etching utilizing a known etching mask. Thereafter, an insulating film 50 is formed on the exposed substrate surface on the thicker part of the substrate 9, on the vertical wall 1114 of the epitaxial growth layers 11 to 14 and on a little portion extending on the top surface of the electrode contacting layer 14. Then utilizing the insulating film 50 as diffusion mask, Zn as a p-type impurity is diffused on the shallow surface part of the electrode contacting layer 14. Thereafter, a p-side electrode 51 is formed on the electrode contacting layer 14. Then, the insulating film 50 is removed at its horizontal part on the top face of the substrate 9 but retained on the vertical wall 1114. Then an n-side electrode 52 is formed on the exposed face of the substrate 9, and a bottom metal film 53 for mounting on a heat sink is formed on the bottom face of the substrate 9 as shown in FIG. 4(f).

A more concrete example of making the semiconductor laser of FIG. 4(f) is elucidated in the following concerning the laser of the second type example utilizing an n-type GaAs substrate and having GaAs, $Ga_{1-x}Al_xAs$, ($0 < X < 1$) construction.

A substrate 9 of n-type conductivity of the carrier concentration of $n \simeq 1 \times 10^{17} Cm^{-3}$ has a (100) face as the principal face. As shown in FIG. 4(a) the substrate is formed into a terrace shape to have a thinner part and a thicker part between which a step of about 2 μm in $<01\bar{1}>$ or $<011>$ direction by a chemical etching employing an etchant containing $H_2SO_4$ and $H_2O_2$ utilizing a photoresist mask. Then, as shown in FIG. 4(b), a 1500Å thick $SiO_2$ film 18 is formed by a chemical vapor deposition (CVD) method on all the principal face including the vertical wall face at the step part 9'. Thereafter, an about 3000Å thick silicon nitride ($Si_3N_4$) film 19 as a diffusion prevention film is formed by sputtering on the thicker part and on the step part 9'. Then, the GaAs substrate is sealed in an evacuated enclosure together with a piece of $ZnAs_2$ as an impurity source of Zn, and the enclosure is raised to 750° C. thereby to diffuse Zn through the silicon oxide film 18 into the surface of the thinner part of the substrate to the depth of about 2 μm by utilizing the silicon nitride film 19 as a diffusion mask. Thereby, a diffused p-type region 10 of the surface carrier concentration of $1-3 \times 10^{17} Cm^{-3}$ and a p-n junction thereunder are formed in the substrate. The silicon dioxide film 18 and the overriding silicon nitride film 19 are removed, consequently forming the terrace shaped substrate 9 having a current limiting diffused region 10 on the thinner part as shown in FIG. 4(c). Then, on the substrate of FIG. 4(c), sequential liquid epitaxial growths are made under the condition of:
  growth starting temperature—845° C.
  cooling rate—0.5° C./min.
to form the following layers as shown in FIG. 4(d),
  first clad layer 11 of—n-type $Ga_{0.65}Al_{0.35}As$ (0.2 μm thick at the horizontal part, Sn doped—$n \simeq 5 \times 10^{17} Cm^{-3}$),
  active layer 12 of—n-type $Ga_{1-y}Al_yAs$, ($0 \leq y \leq 0.05$) (0.05 μm thick at the horizontal part, non-doped—$n = 2-3 \times 10^{16} Cm^{-3}$),
  second clad layer 13 of—p-type $Ga_{0.65}Al_{0.35}As$ (1 μm thick at the part above the thicker part of substrate, Ge-doped—$p \simeq 1 \times 10^{17} Cm^{-3}$), and an
  electrode contacting layer 14 of—p-type GaAs (1 μm thick at the part above the thicker part of substrate, Ge-doped—$p \simeq 1 \times 10^{18} Cm^{-3}$).

The thickness of the triangular part 111 formed in the first clad layer 11 at the foot of the step 9' is about 1 μm and the thickness of the oblique active region 121 on the triangular part 111 is about 0.06 μm. Then, parts of the epitaxial growth layers 11 to 14 which are on the thicker part of the substrate 9 are removed by chemical etching utilizing a known etching mask. Thereafter, a 3000Å thick $Si_3N_4$ film 50 is formed by sputtering on the exposed substrate surface on the thicker part of the substrate 9, on the vertical wall 1114 of the epitaxial growth layers 11 to 14 and on a little portion extending on the top surface of the electrode contacting layer 14. Then, utilizing the $Si_3N_4$ film 50 as a diffusion mask, Zn as a p-type impurity is duffused to form a Zn diffusion layer of 0.5 μm depth and surface concentration of $1 \times 10^{19} Cm^{-3}$. Thereafter, a p-side electrode 51 of Au-Ge-Ni alloy is formed by vapor deposition followed by an alloying treatment on the electrode contacting layer 14. Then, the $Si_3N_4$ film 50 is partly removed at its horizontal part on the top face of the substrate 9, but retained on the vertical wall 1114. Then an n-side electrode 52 of Au-Ge-Ni alloy is formed by vapor deposition followed by an alloying treatment on the exposed face of the substrate 9. A bottom metal film 53 for mounting on a heat sink is formed on the bottom face of the substrate 9 by vapor-depositing Sn as shown in FIG. 4(f).

The laser made by the abovementioned steps has the current limiting layer 10 under the lower horizontal part and the oblique active region 121 of the active layer 12, and therefore most of the current injected from the p-side electrode 51 is necessarily converged to pass from the p-side electrode 51 through the oblique action region 121 of the active layer 12 and triangular part 111 of the first clad layer 11 and flows almost horizontally through the vertical wall part at the step 9' of the substrate 9. Thus, since the current path is narrowly converged by the vertical wall part at the step 9', the current is effectively converged to and injected almost vertically into the oblique active region 121, thereby improving injection efficiency. Besides, because the active region 121 is defined by the bent parts on both sides thereof, confinement of the fundamental transverse mode is easy, thereby a stable single spot lasing is obtainable, and coupling efficiency with optical fibers is improved to about twice that of the conventional laser.

As elucidated in detail, the semiconductor laser shown in FIGS. 4(a) to 4(f) has the advantages that due to provision of both p-side and n-side electrodes on the top surface of the epitaxial growth layers the reliablity and utility are increased when integrated in a monolithic wafer together with other electronic circuit elements, and due to provision of the metal film formed on the substrate bottom face for connection to a heat sink, the reliability of and coupling efficiency to the optical fibre is increased.

In a modified example, instead of the Zn-diffused p-type layer, the current limiting layer 10, which is formed on the surface of the thinner part of the substrate 9, can be formed as an epitaxial layer having the conductivity opposite to that of the substrate 9. For example a p-type Ge doped GaAs epitaxial layer formed by vapor phase epitaxial growth on the n-type GaAs substrate in the abovementioned more concrete example described referring to FIG. 2(e) or FIG. 4(f) may be used. In another modified example, the current limiting layer 10, which is formed on the surface of the thinner part of the substrate 9, can be formed as a high resistivity layer of, for example, a Fe-doped GaAs layer having the resistivity of over $10^6$ ΩCm formed by vapor-phase epitaxial growth using a known photoresist mask.

What we claim is:

1. In a semiconductor laser including
  a terrace shaped substrate having a step between a thicker and a thinner part,
  epitaxially grown layers including a first clad layer and an active layer, said active layer being disposed on said first clad layer and having an upper horizontal part formed above said thicker part of said substrate and a lower horizontal part formed above said thinner part of said substrate and a strip shaped oblique active region formed between said upper and said lower horizontal parts, and
  an electrode formed on said epitaxially grown layers at least above said oblique active region,
  wherein the improvement comprises:
  a current limiting layer for preventing a current from flowing therethrough, said current limiting layer being disposed between said first clad layer and said thinner part of the substrate in a manner to cover said thinner part by extending to the lower end of the step,
  the thickness of said current limiting layer being less than the height of said step thereby allowing said step part of the substrate to contact the lowest layer of said epitaxially grown layers.

2. A semiconductor laser in accordance with claim 1, wherein said electrode is formed on a part above the thinner part of the substrate and another electrode is formed on said epitaxially grown layers at a part above said thicker part of said substrate in an isolated relation from said first mentioned electrode.

3. A semiconductor laser in accordance with claim 1 wherein said current limiting layer is a diffused layer having the opposite conductivity of that of the substrate.

4. A semiconductor laser in accordance with claim 1 wherein said current limiting layer is an epitaxial layer having the opposite conductivity to of that of the substrate.

5. A semiconductor laser in accordance with claim 1 wherein said current limiting layer is a high resistivity layer.

6. A semiconductor laser in accordance with claim 1, wherein the strip shaped oblique active region is further defined by an upper bending part formed between said active region and the upper horizontal part and a lower bending part formed between said active region and the lower horizontal part.

* * * * *